(12) United States Patent
Yin et al.

(10) Patent No.: US 6,380,611 B1
(45) Date of Patent: Apr. 30, 2002

(54) TREATMENT FOR FILM SURFACE TO REDUCE PHOTO FOOTING

(75) Inventors: Zhiping Yin; Gurtej S. Sandhu, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/146,674

(22) Filed: Sep. 3, 1998

(51) Int. Cl.[7] ............................................... H01L 23/58
(52) U.S. Cl. ..................... 257/649; 257/639; 257/640; 257/797; 430/325; 438/714
(58) Field of Search ................................. 257/632, 649, 257/797, 639, 640; 438/714, 743, 744; 430/325, 313

(56) References Cited

U.S. PATENT DOCUMENTS

| 4,557,797 A | 12/1985 | Fuller et al. ................. 156/643 |
| 5,486,267 A | * 1/1996 | Knight et al. .......... 156/659.11 |
| 5,710,067 A | 1/1998 | Foote et al. ................. 257/632 |

OTHER PUBLICATIONS

He et al., Investigating Positive DUV Resist Profile on TiN, SPIE Conference, Feb. 1998.*
Qizhi He et al., Investigating Positive DUV Resist Profile on TiN, SPIE Conference, Feb. 1998, 9 pages.
Lori Anne Joesten et al., Footing Reduction of Positive Deep–UV Photoresists on Plasma Enhanced ARL (PE ARL) SiON Substrates, SPIE Conference, Feb. 1998, 11 pages.

* cited by examiner

Primary Examiner—Minh Loan Tran
(74) Attorney, Agent, or Firm—Killworth, Gottman, Hagan & Schaeff, L.L.P.

(57) ABSTRACT

An improved photolithography technique is provided whereby the beneficial effects of using an anti-reflective coating may be realized while maintaining critical dimensions in each subsequent step. This improvement is realized by the treatment of the anti-reflective coating with a gaseous plasma or a solution of sulfuric acid and hydrogen peroxide. By treating the anti-reflective coating with gaseous plasma or solution of sulfuric acid and hydrogen peroxide, no "footing" results and the critical dimensions as set by the photoresist mask are preserved to provide an accurately patterned mask for subsequent steps.

24 Claims, 5 Drawing Sheets

TREATMENT FOR FILM SURFACE TO REDUCE PHOTO FOOTING

FIELD OF THE INVENTION

The present invention relates generally to patterning techniques in the fabrication of semiconductor devices. In particular, the present invention relates to the treatment of anti-reflective coatings to reduce photo footing problems.

BACKGROUND OF THE INVENTION

The escalating requirements for high density and performance associated with ultra large scale integration impose correspondingly high demands on photolithographic techniques.

Conventional photolithographic techniques utilize a photoresist, i.e., a polymeric composition wherein a developer solvent will selectively remove only the exposed (or, for different compositions, selectively only the unexposed) portions of the photoresist. This leaves a patterned photoresist layer in place which provides a patterned mask for subsequent steps such as ion implementation, etching, or patterned deposition of materials by lift-off techniques (i.e., depositing a material over all and then removing the remaining portions of photoresist to leave the material only where the photoresist was not present). Since critical dimensions on the semiconductor device are predetermined by the dimensions of the openings in the photoresist curing mask, it essential that each step in the photolithography process transfer an accurate patterned mask for each subsequent step, i.e, that critical dimensions are maintained throughout the photolithography process.

A problem with conventional photolithography is pattern degradation resulting from the reflection of light from the layer being patterned. Anti-reflective coatings have been used in an attempt to solve this problem. Anti-reflective coatings are designed, by appropriate adjustment of variables such as composition, deposition conditions, and reaction conditions, to exhibit the requisite optical parameters to suppress multiple interference effects caused by the interference of light rays propagating in the same direction due to multiple reflections in the photoresist film. The effective use of an anti-reflective coating enables patterning and alignment without disturbance caused by such multiple interference, thereby improving line width accuracy and alignment, which are critical factors with respect to achieving fine patterns with minimal spacing. For example, the use of an anti-reflective coating is particularly significant when forming a via or contact hole over a stepped area, as when etching a dielectric layer deposited on a gate electrode and gate oxide formed on a semiconductor substrate in manufacturing a field effect transistor.

Typically, anti-reflective coatings are spun onto the wafer surface and a photoresist is then spun on top of the anti-reflective coating. After masking, the photoresist is cured and the wafer developed by means of wet chemical etching to remove the uncured (or cured, depending on photoresist) portions of the photoresist and those portions of the anti-reflective coating lying beneath the uncured (or cured, depending on photoresist) photoresist. In order to maintain critical dimensions, the development step should completely remove all portions of the anti-reflective coating lying beneath the uncured (or cured, depending on photoresist) photoresist. In other words, the pattern in the anti-reflective coating should accurately reflect the pattern in the photoresist after the development step. When there is this identity in pattern between the photoresist and the anti-reflective coating after the development step, the anti-reflective coating becomes an accurate mask for the patterning of subsequent layers and thus, critical dimensions in the resulting fabricated semiconductor device are maintained.

However, this identity in pattern between the photoresist and anti-reflective coating after the development step is not always realized due to the formation of a "foot" on the anti-reflective coating. Although the manifestation of a "foot" on anti-reflective coatings is well-known and various theories exist as to their cause, the "foot" abnormality has not, to date, been fully understood. Nonetheless, these "footings" narrow the opening in the photoresist through which the anti-reflective material is to be removed and removal of the anti-reflective material through this opening results in an anti-reflective layer which is an inaccurate mask for subsequent layers. Thus, the formation of a "footing" changes the critical dimensions in the resulting fabricated semiconductor device.

Therefore, in the fabrication of semiconductor devices, there exists a need for an improved photolithography technique whereby the beneficial effects of an anti-reflective coating may be realized while maintaining critical dimensions in each subsequent step through accurate transfer of pattern masks.

SUMMARY OF THE INVENTION

That need is met by the present invention. Thus, in one embodiment, there is provided a film comprising a layer of an anti-reflective coating which has been treated with a gaseous plasma or a solution of sulfuric acid and hydrogen peroxide. This film may consist entirely of a layer of anti-reflective coating which has been treated with a gaseous plasma or solution of sulfuric acid and hydrogen peroxide or may consist of a plurality of layers, with at least one layer being an anti-reflective coating which has been treated with a gaseous plasma or solution of sulfuric acid and hydrogen peroxide. For example, the film may consist of a dielectric layer, such as silicon dioxide or silicon nitride, overlaid with an anti-reflective coating which has been treated with gaseous plasma or solution of sulfuric acid and hydrogen peroxide. The anti-reflective coating is an inorganic dielectric material, typically selected from the group consisting of silicon-rich oxides defined by the formulas $Si_xO_y$ and $Si_xO_y:H_n$, and silicon-rich oxynitrides, defined by the formulas $Si_xO_yN_z$ and $Si_xO_yN_z:H_n$, and silicon nitrides defined by the formulas $Si_xN_z$ and $Si_xN_z:H_n$, wherein in all formulas, x, y, z, and n represent the atomic percentage of silicon, oxygen, nitrogen, and hydrogen, respectively, and wherein x is from about 0.36 to about 0.65, y is from about 0.02 to about 0.56, z is from about 0.07 to about 0.33, and n is from about 0.01 to about 0.30. For example, one such anti-reflective coating is selected from the group consisting of silicon-rich oxynitrides defined by the formulas $Si_xO_yN_z$, wherein x=0.54, y=0.36, and z=0.10. The anti-reflective layer is typically deposited to a thickness range of from about 100 Å to about 1000 Å. However, as one of ordinary skill in the art would readily realize, the particular thickness of the anti-reflective layer will be dependent upon the thickness and composition of the existing film stack upon which the anti-reflective coating is being deposited. Gaseous plasmas for treating the anti-reflective coating are typically selected from the group consisting of $O_2$, $N_2O$, $O_3$, He, $O_2$/He, $N_2O$/He, and $O_3$/He. Solutions of sulfuiric acid and hydrogen peroxide for treating the anti-reflective coating are well known to one of ordinary skill in the art.

In another embodiment of the present invention, there is provided a semiconductor device having at least one layer of an anti-reflective coating which has been treated with either a gaseous plasma or a solution of sulfuric acid and hydrogen peroxide.

In yet another embodiment, there is provided a method of patterning a silicon structure comprising: a) depositing an anti-reflective coating on an uppermost layer of a silicon substrate; b) treating the anti-reflective coating with gaseous plasma to form a plasma-treated anti-reflective coating; c) depositing a photoresist over the plasma-treated anti-reflective coating; d) providing a patterning mask; e) curing the photoresist through the mask to provide a pattern in the photoresist comprised of cured and uncured portions of photoresist, thereby setting pattern dimensions for subsequent steps; f) selectively removing either cured or uncured portions of the photoresist, thereby forming a pattern in the photoresist; g) removing those portions of the plasma-treated anti-reflective coating lying beneath the selectively removed cured or uncured portion of the photoresist, thereby forming a pattern in the plasma-treated anti-reflective coating, wherein the pattern in the plasma-treated anti-reflective coating has substantially the same dimensions as the pattern in the photoresist; and h) removing those portions of the uppermost layer of the silicon wafer lying beneath those portions of the plasma-treated anti-reflective coating which have been removed, thereby forming a pattern in the uppermost layer of the silicon wafer, wherein the pattern in the uppermost layer of the silicon wafer has substantially the same dimensions as the pattern in the plasma-treated anti-reflective coating. The removal of the plasma-treated anti-reflective coating in step g) and the removal of the uppermost layer of the silicon wafer in step h) may be carried out as two distinct steps or, alternatively, they may be carried out in one step.

In yet another embodiment, there is provided a method of patterning a silicon structure comprising: a) depositing an anti-reflective coating on an uppermost layer of a silicon substrate; b) treating the anti-reflective coating with a solution of sulfuric acid and hydrogen peroxide to form a sulfuric acid/hydrogen peroxide-treated anti-reflective coating; c) depositing a photoresist over the sulfuric acid/ hydrogen peroxide-treated-anti-reflective coating; d) providing a patterning mask; e) curing the photoresist through the mask to provide a pattern in the photoresist comprised of cured and uncured portions of photoresist, thereby setting pattern dimensions for subsequent steps; f) selectively removing either cured or uncured portions of the photoresist, thereby forming a pattern in the photoresist; g) removing those portions of the sulfuric acid/hydrogen peroxide-treated anti-reflective coating lying beneath the selectively removed cured or uncured portion of the photoresist, thereby forming a pattern in the sulfuric acid/hydrogen peroxide-treated anti-reflective coating, wherein the pattern in the sulfuric acid/hydrogen peroxide-treated anti-reflective coating has substantially the same dimensions as the pattern in the photoresist; and h) removing those portions of the uppermost layer of the silicon wafer lying beneath those portions of the sulfuric acid/hydrogen peroxide-treated anti-reflective coating which have been removed, thereby forming a pattern in the uppermost layer of the silicon wafer, wherein the pattern in the uppermost layer of the silicon wafer has substantially the same dimensions as the pattern in the sulfuric acid/hydrogen peroxide-treated anti-reflective coating. The removal of the sulfuric acid/hydrogen peroxide-treated anti-reflective coating in step g) and the removal of the uppermost layer of the silicon wafer in step h) may be carried out as two distinct steps or, alternatively, they may be carried out in one step.

In still yet another embodiment, there is provided a method of forming a mask on a silicon structure which comprises: a) depositing an anti-reflective coating on an uppermost layer of a silicon substrate; b) treating the anti-reflective coating with a gaseous plasma to form a plasma-treated anti-reflective coating; c) depositing a photoresist over the plasma-treated anti-reflective coating; d) providing a patterning mask; e) curing the photoresist through the mask to provide a pattern in the photoresist comprised of cured and uncured portions of photoresist, thereby setting pattern dimensions for subsequent steps; f) selectively removing either cured or uncured portions of the photoresist, thereby forming a pattern in the photoresist; and g) removing those portions of the plasma-treated anti-reflective coating lying beneath the selectively removed cured or uncured portions of the photoresist, thereby forming the mask on the silicon structure.

In still yet another embodiment, there is provided a method of forming a mask on a silicon structure which comprises: a) depositing an anti-reflective coating on an uppermost layer of a silicon substrate; b) treating the anti-reflective coating with a solution of sulfuric acid and hydrogen peroxide to form a sulfuiric acid/hydrogen peroxide-treated anti-reflective coating; c) depositing a photoresist over the sulfuric acid/peroxide-treated anti-reflective coating; d) providing a patterning mask; e) curing the photoresist through the mask to provide a pattern in the photoresist comprised of cured and uncured portions of photoresist, thereby setting pattern dimensions for subsequent steps; f) selectively removing either cured or uncured portions of the photoresist, thereby forming a pattern in the photoresist; and g) removing those portions of the sulfuric acid/hydrogen peroxide-treated anti-reflective coating lying beneath the selectively removed cured or uncured portions of the photoresist, thereby forming the mask on the silicon structure.

DETAILED DESCRIPTION OF THE INVENTION

The present invention provides an improved photolithography technique whereby the beneficial effects of using an anti-reflective coating may be realized while maintaining critical dimensions in each subsequent step through accurate transfer of pattern masks. This improvement is realized by the treatment of the anti-reflective coating with a gaseous plasma or a solution of sulfuric acid and hydrogen peroxide. By treating the anti-reflective coating with a gaseous plasma or a solution of sulfuric acid and hydrogen peroxide, little or no "footing" occurs. Therefore, after the development step, the pattern in the anti-reflective coating accurately reflects the pattern in the photoresist, the anti-reflective coating therefore becomes an accurate mask for the patterning of subsequent layers and thus, critical dimensions in the resulting fabricated semiconductor device are maintained.

As used herein, the term "opening" refers to vias, trenches, grooves, contact holes, and the like in silicon substrates. Also, according to the present invention, the term "silicon substrate" refers to silicon structures, including silicon wafers, silicon structures in the process of fabrication, any layer on a silicon substrate which is in the process of fabrication, a semiconductor layer, including a semiconductor layer in the process of fabrication, and the like. The term "silicon wafer" means either the lowest layer of a semiconductor material in a wafer or a wafer having additional layers or structures formed thereon. The term "fabrication" means the process of forming patterns on a silicon structure or semiconductor structure through photolithography.

FIGS. 1, 2, 3, and 4 show a photolithography process using an untreated anti-reflective coating, showing the inaccurate pattern transfer and resultant changes to critical dimensions.

Figure 1:
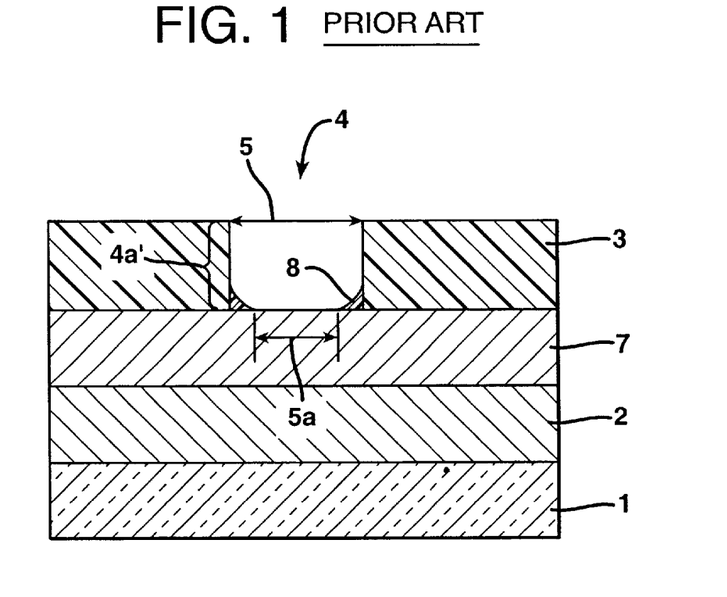
FIG. 1 depicts a cross-section of a silicon substrate overlaid with a dielectric layer which is in turn overlaid with an anti-reflective coating which is in turn overlaid with a photoresist and having an opening through the photoresist, showing "footing".

FIG. 1 shows a silicon structure wherein a photoresist 3 overlying an anti-reflective coating 7 has been patterned by means of exposure through a photoresist mask, thereby forming a first mask. FIG. 1 shows a cross-section of a silicon substrate 1 overlaid with a dielectric layer 2 which is in turn overlaid with an anti-reflective coating 7 which is in turn overlaid with a photoresist 3. Photoresist 3 has an opening 4 which is defined by depth 4a through the photoresist 3, width 5 as the top of opening 4, and width 5a at the interface of anti-reflective coating 7 and photoresist 3. A footing 8 is formed at the interface of the anti-reflective coating 7 and the photoresist 3. This footing is not removed by typical development techniques. Therefore, after curing and development of the photoresist 3, footings 8 are left at the bottom and sides of opening 4 through the photoresist, resulting in the width 5a at the interface of the anti-reflective coating 7 and the photoresist 3 being narrower than width 5 at the top of opening 4, i.e., the mask pattern has been inaccurately transferred to the photoresist 3.

Figure 2:
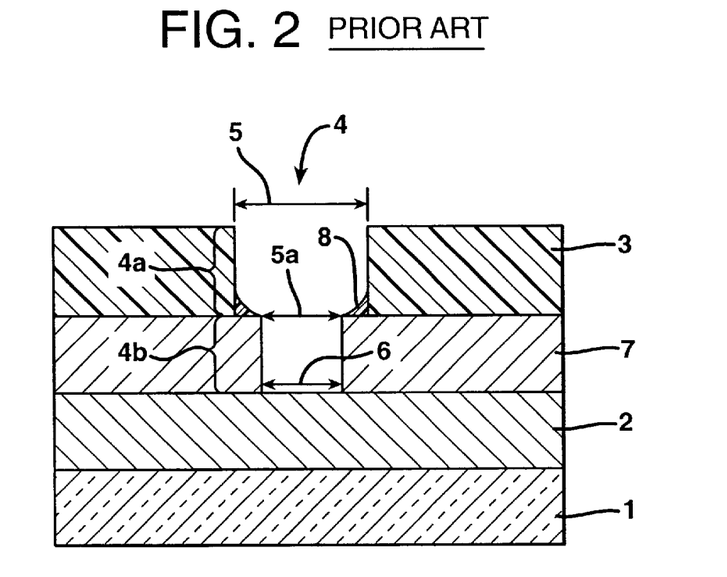
FIG. 2 depicts a cross-section of a silicon substrate overlaid with a dielectric layer which is in turn overlaid with an anti-reflective coating which is in turn overlaid with a photoresist and having an opening through the photoresist and anti-reflective coating, wherein the portion of the opening through the anti-reflective coating is narrower than the portion of the opening through the photoresist.

FIG. 2 shows the transfer of the pattern in the photoresist 3 of FIG. 1 to the anti-reflective coating 7, thereby forming a second mask. FIG. 2 shows a cross-section of the silicon structure of FIG. 1, wherein the portion of the anti-reflective coating 7 lying underneath opening 4 as defined by depth 4a through photoresist 3 and width 5a at the interface of the anti-reflective coating 7 and photoresist 3, is removed. Although shown in FIG. 1 and FIG. 2 as two distinct stages, one of ordinary skill in the art will appreciate that the development of photoresist 3 and removal of the portion of the anti-reflective coating 7 lying underneath opening 4 as defined by depth 4a through photoresist 3 and width 5a at the interface of the anti-reflective coating 7 and photoresist 3, occur under the same conditions and are conducted in the same process step. In FIG. 2, silicon substrate 1 is overlaid with a dielectric layer 2 which is in turn overlaid with an anti-reflective coating 7 which is in turn overlaid with a photoresist 3 and having an opening 4 through the photoresist 3 and anti-reflective coating 7, wherein opening 4 is defined by depth 4a through photoresist 3, depth 4b through the anti-reflective coating 7, width 5 at the top of opening 4, width 5a at the interface of the anti-reflective coating 7 and the photoresist 3, and width 6 at the interface of dielectric layer 2 and anti-reflective coating 7. As the result of width 5a in opening 4 being narrower than width 5 in opening 4, removal of the portion of the anti-reflective coating 7 lying underneath opening 4 as defined by depth 4a through photoresist 3 and width 5a at the interface of the anti-reflective coating 7 and photoresist 3, results in the formation of the portion of the opening 4 defined by depth 4b through the anti-reflective coating 7 being narrower than the portion of the opening 4 defined by depth 4a through the photoresist 3, i.e., the pattern in the photoresist 3 has been inaccurately transferred to the anti-reflective coating 7 as well.

Figure 3:
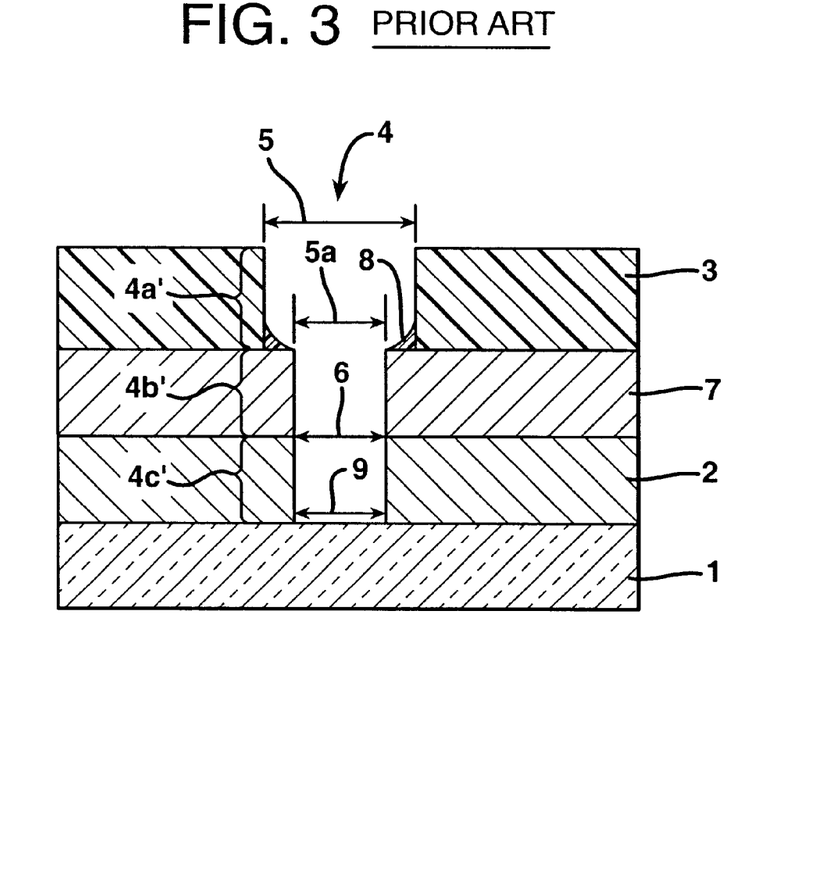
FIG. 3 depicts a cross-section of a silicon substrate overlaid with a dielectric layer which is in turn overlaid with an anti-reflective coating which is in turn overlaid with a photoresist and having an opening through the photoresist, anti-reflective coating, and dielectric layer, wherein the portion of the opening through the dielectric layer and anti-reflective coating is narrower than the portion of the opening through the photoresist.

FIG. 3 shows the transfer of the pattern in the anti-reflective coating 7 in FIG. 2 to the dielectric layer 2. FIG.

3 shows a cross-section of the silicon structure of FIG. 2 wherein the portion of dielectric layer 2 is etched through opening 4. FIG. 3 depicts a cross-section of a silicon substrate 1 overlaid with a dielectric layer 2 which is in turn overlaid with an anti-reflective coating 7 which is in turn overlaid with a photoresist 3 and having an opening 4 through the photoresist 3, anti-reflective coating 7, and dielectric layer 2. The portion of the opening 4 through the dielectric layer 2 is defined by depth 4c, width 9 at the interface of the silicon substrate 1 and the dielectric layer 2, and depth 6 at the interface of the dielectric layer 2 and the anti-reflective coating 7. The portion of the opening 4 through the anti-reflective coating 7 is defined by depth 4b, width 6 at the interface of the dielectric layer 2 and the anti-reflective coating 7, and, width 5a at the interface of the anti-reflective coating 7 and the photoresist 3. Finally, the portion of the opening 4 through the photoresist 3 is defined by depth 4a, width 5a at the interface of the anti-reflective coating 7 and photoresist 3 and width 5 at the top of opening 4. As a result of width 6 at the interface of the dielectric layer 2 and the anti-reflective coating 7 being narrower than width 5 at the top of the opening 4, the portion of opening 4 through the dielectric layer 2 is narrower than the portion of the opening 4 through the photoresist 3, i.e., the pattern in the anti-reflective coating 7 has been inaccurately transferred to the dielectric layer 2.

Figure 4:
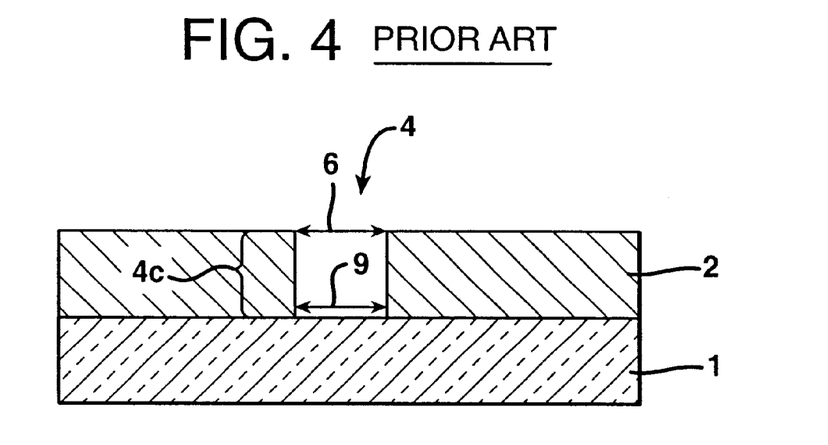
FIG. 4 depicts a cross-section of a silicon substrate overlaid with a dielectric layer and having an opening through the dielectric layer.

FIG. 4 shows the silicon structure at the end of the photolithography process, i.e., FIG. 4 shows a cross-section of the silicon structure of FIG. 3 wherein the photoresist 3 and anti-reflective coating 7 have been stripped from the dielectric layer 2. FIG. 4 shows a silicon substrate 1 overlaid with a dielectric layer 2 and having an opening 4 through the dielectric layer 2, wherein opening 4 is defined by depth 4c through dielectric layer 2, width 9 at the interface of the silicon substrate 1 and the dielectric layer 2, and width 6 at the top of the opening 4. As a result of the portion of opening 4 through the dielectric layer 2 being narrower than the portion of the opening 4 through the photoresist 3, as shown in FIG. 3, critical dimensions have been not been maintained throughout the photolithography process as a result of inaccurate pattern transfer during the process.

FIGS. 5, 6, 7, 8, 9, 10 and 11 show the photolithography process of the present invention which uses an anti-reflective coating treated with a gaseous plasma or a solution of sulfuric acid and hydrogen peroxide which results in the maintenance of critical dimensions. Although the following description describes the practice of the present invention in terms of a specific silicon structure, i.e., a silicon substrate overlaid with a dielectric layer, it is to be understood that the invention is capable of being practiced on any silicon structure.

Figure 5:
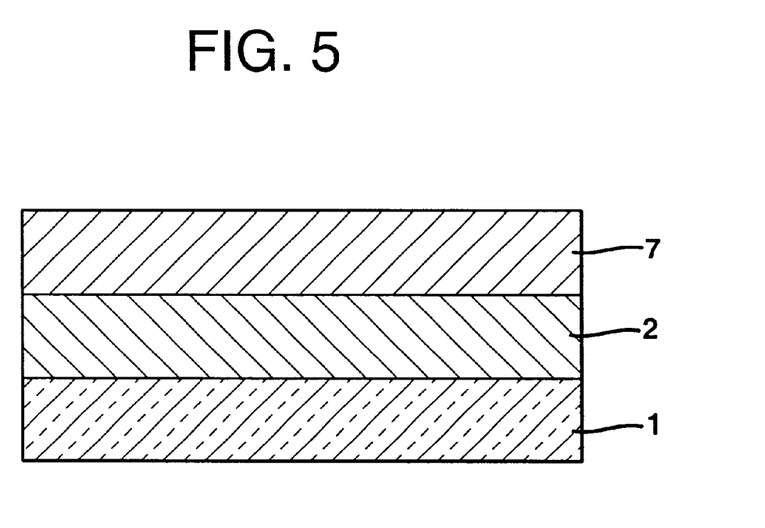
FIG. 5 depicts a cross-section of a silicon substrate overlaid with a dielectric layer which is in turn overlaid with an anti-reflective coating.

FIG. 5 shows a cross-section of a silicon structure comprised of a plurality of layers wherein silicon substrate 1 is overlaid with a dielectric layer 2 which is in turn overlaid with an anti-reflective coating 7. Typical dielectric layers 2 are silicon dioxide, silicon nitride, and the like. Typical anti-reflective coatings 7 are selected from the group consisting of silicon-rich oxides defined by the formulas $Si_xO_y$ and $Si_xO_y:H_n$, and silicon-rich oxynitrides, defined by the formulas $Si_xO_yN_z$ and $Si_xO_yN_z:H_n$, and silicon nitrides defined by the formulas $Si_xN_z$ and $Si_xN_z:H_n$, wherein in all formulas, x, y, z, and n represent the atomic percentage of silicon, oxygen, nitrogen, and hydrogen, respectively. An example of an anti-reflective coating 7 for use in the present invention are silicon-rich oxynitrides defined by the formula $Si_xO_yN_z$, wherein x=0.54, y=0.36, and z=0.10. These silicon-rich oxides, silicon nitrides, and silicon-rich oxynitrides are well known to one of ordinary skill in the art. The anti-reflective coating 7 is deposited using plasma-enhanced chemical-vapor deposition (PECVD) techniques well known to one of ordinary skill in the art. The anti-reflective coating 7 is typically deposited at a temperature range of from about room temperature to about 600° C., with about 400° C. being preferred; at a pressure range of from about 1 torr to about 10 torr, with about 5 torr being preferred; at a RF power of from about 90 W to about 120 W; at a space of from about 450 mils to about 550 mils. As one of ordinary skill in the art with readily appreciate, the thickness of the anti-reflective coating 7 will depend upon the number of layers on the silicon structure and the anti-reflective coating 7 properties. However, anti-reflective coating 7 is typically deposited to a thickness range of from about 100 Å to about 1000 Å, with about 300 Å to about 600 Å being preferred. Table 1 represents typical deposition conditions suitable for depositing silicon-rich oxynitrides $Si_xO_yN_z:H_n$:

TABLE 1

EXEMPLARY DEPOSITION CONDITIONS

|  | Example 1 | Example 2 | Example 3 | Example 4 | Example 5 | Example 6 | General |
|---|---|---|---|---|---|---|---|
| Temperature, ° C. | 400 | 400 | 400 | 400 | 400 | 400 | 300–400 |
| Pressure, torr | 5.6 | 4.7 | 5.2 | 5.8 | 5.6 | 5.2 | 4.7–6.0 |
| RF Power W | 100 | 120 | 100 | 100 | 100 | 100 | 90–120 |
| Space, mils | 450–500 | 550 | 450 | 500 | 500 | 500 | 450–550 |
| $SiH_4$, sccm | 80–88 | 255 | 89 | 222 | 45–61 | 80 | 40–260 |
| $N_2O$, sccm | 80–141 | 550 | 195 | 500 | 80–95 | 350 | 80–600 |
| $N_2$, sccm | 0 | 0 | 0 | 0 | 200–300 | 0 | 0–300 |
| He, sccm | 2200 | 2200 | 2200 | 2200 | 1300 | 2200 | 1000–2500 |

Figure 6:
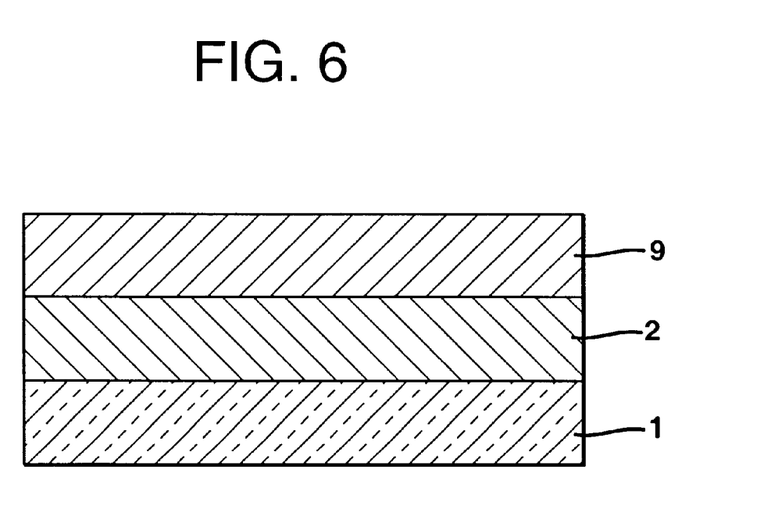
FIG. 6 depicts a cross-section of a silicon substrate overlaid with a dielectric layer which is in turn overlaid with an anti-reflective coating, and then treated with gaseous plasma or a solution of sulfuiric acid and hydrogen peroxide.

FIG. 6 shows a cross-section of the silicon structure of FIG. 5 wherein the anti-reflective coating 7 (not shown) has been treated with a gaseous plasma or a solution of sulfuric acid and hydrogen peroxide. Therefore, FIG. 6 shows a silicon substrate 1 overlaid with a dielectric layer which is in turn overlaid with an anti-reflective coating 7 (not shown), and then treated with gaseous plasma or a solution of sulfuric acid and hydrogen peroxide to give plasma-treated anti-reflective coating or sulfuric acid/hydrogen peroxide-treated anti-reflective coating 9.

When anti-reflective coating 7 in the silicon structure of FIG. 5 is treated with a gaseous plasma, typical gaseous plasmas are selected from the group consisting of $O_2$, $N_2O$, $O_3$, He, $O_2$/He, $N_2O$/He, and $O_3$/He. Treatment with gaseous plasma will typically lasting from about 10 seconds to about 30 seconds and occur at a temperature range of from about 300° C. to about 500° C.; at a pressure of from about 2.0 torr to about 6.0 torr; at an RF power of from about 200 W to about 1500 W; at a space of from about 400 mils to about 600 mils; and with a gaseous flow rate of from about 300 sccm to about 2000 sccm. Plasma treatment may be performed immediately after deposition of the anti-reflective coating or just prior to spinning on the photoresist. The gaseous plasma may be generated in situ, i.e., the silicon structure of FIG. 5 is placed in a chamber and the gas introduced, with a plasma field energizing the gas to a plasma state in the presence of the silicon structure of FIG. 5. Alternatively, the gaseous plasma may be generated downstream, i.e., the silicon structure of FIG. 5 is placed in one chamber and the gaseous plasma is generated in a separate plasma chamber to avoid exposing the silicon structure of FIG. 5 to the high energy plasma field. Such downstream gaseous plasma treatments are similar to those utilized in Mattson and/or Fussion photoresist stripping techniques which utilize $O_2$.

Table II represents typical plasma-treatment conditions suitable for use in the present invention.

TABLE II

EXEMPLARY PLASMA TREATMENT CONDITIONS

|  | Example 1 | Example 2 | General |
|---|---|---|---|
| Temperature, ° C. | 400 | 400 | 300–500 |
| Pressure, torr | 5.0 | 3.5 | 2.0–6.0 |
| RF Power, W | 800 | 350 | 200–1500 |
| Space, mils | 450–500 | 450–500 | 400–600 |
| gas*, sccm | 1000 sccm | 750 sccm | 300–2000 sccm |
| He, sccm | 400 | 400 | 0–2000 |

*$O_2$, $N_2O$, $O_3$ or He

When the anti-reflective coating 7 in the silicon structure of FIG. 5 is treated with a solution of sulfuric acid and hydrogen peroxide, typical treatment conditions are to treat the silicon structure of FIG. 5 with a solution comprising about 98% of sulfuric acid, about 0.5% of hydrogen peroxide, and about 1.5% of water, for a time period of from about 2 seconds to about 30 seconds, with about 10 seconds being preferred, at a temperature range of from about 100° C. to about 140° C., with about 120° C. being preferred.

Figure 7:
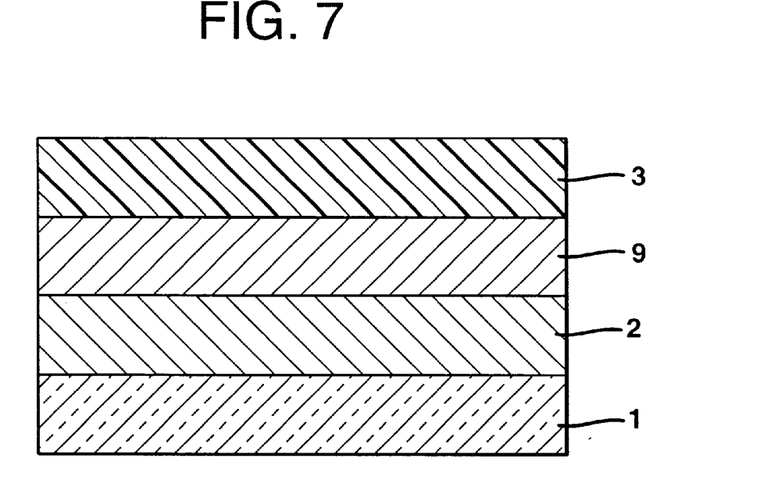
FIG. 7 depicts a cross-section of a silicon substrate overlaid with a dielectric layer which is in turn overlaid with an anti-reflective coating, and then treated with gaseous plasma or a solution of sulfuric acid and hydrogen peroxide, and then overlaid with a photoresist.

FIG. 7 depicts a cross-section of the silicon structure of FIG. 6 wherein a photoresist 3 has been deposited over the plasma-treated anti-reflective coating or sulfuric acid/hydrogen peroxide-treated anti-reflective coating 9. FIG. 7 shows a silicon substrate 1 overlaid with a dielectric layer 2 which is in turn overlaid with an anti-reflective coating 7 (not shown) which is treated with gaseous plasma or a solution of sulfuric acid and hydrogen peroxide to give plasma-treated anti-reflective coating or sulfuric acid/hydrogen peroxide-treated anti-reflective coating 9 as described in FIG. 6, and then overlaid with a photoresist 3. Photoresists 3 for use in FIG. 7 are typical photoresists known in the art. As such, one of ordinary skill in the art will readily appreciate suitable methods and conditions for their deposition.

Figure 8:
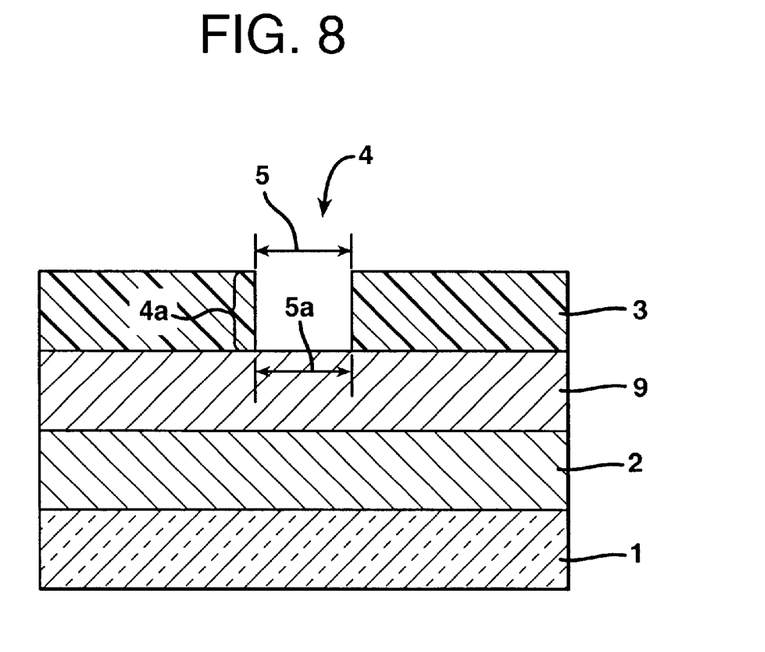
FIG. 8 depicts a cross-section of a silicon substrate overlaid with a dielectric layer which is in turn overlaid with an anti-reflective coating, then treated with gaseous plasma or a solution of sulfuric acid and hydrogen peroxide, and then overlaid with a photoresist and having an opening through the photoresist.

FIG. 8 shows a silicon structure of FIG. 7 wherein the photoresist 3 overlying the anti-reflective coating 7 has been patterned by means of exposure through a photoresist mask, thereby forming a first mask. FIG. 8 depicts a cross-section of a silicon substrate 1 overlaid with a dielectric layer 2 which is in turn overlaid with an anti-reflective coating 7 (not shown) which has been treated with gaseous plasma or a solution of sulfuric acid and hydrogen peroxide to give plasma-treated anti-reflective coating or sulfuric acid/hydrogen peroxide-treated anti-reflective coating 9 as described in FIG. 6. The plasma-treated anti-reflective coating or sulfuiric acid/hydrogen peroxide treated anti-reflective coating 9 is overlaid with photoresist 3, and has an opening 4 through the photoresist 3. The portion of the opening 4 through the photoresist 3 is defined by a depth 4a, a width 5 at the top of the opening 4, and a width 5a at the interface of the plasma-treated anti-reflective coating or sulfuric acid/hydrogen peroxide-treated anti-reflective coating 9 and the photoresist 3. As a result of plasma treating or sulfuric acid/hydrogen peroxide treating of the anti-reflective coating 7 as described in FIG. 6, no footing is formed at the interface of the plasma-treated anti-reflective coating or sulfuric acid/hydrogen peroxide-treated anti-reflective coating 9 and the photoresist 3. Therefore, no footings remain left at the bottom and sides of opening 4 as defined by depth 4a through photoresist 3 after development of photoresist 3. As a result, width 5a at the interface of the plasma-treated anti-reflective coating or sulfuric acid/hydrogen peroxide-treated anti-reflective coating 9 and photoresist 3 is essentially the same as width 5 at the top of opening 4 through photoresist 3, i.e., the mask pattern has been accurately transferred to the photoresist 3.

Figure 9:
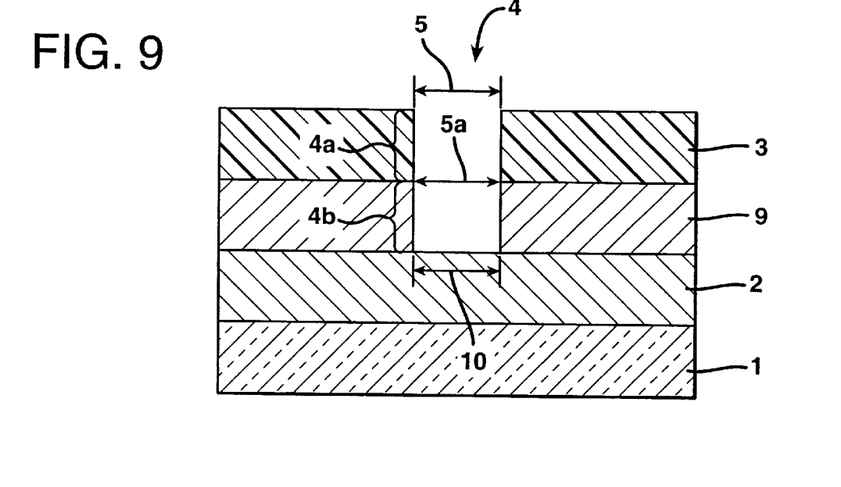
FIG. 9 depicts a cross-section of a silicon substrate overlaid with a dielectric layer which is in turn overlaid with an anti-reflective coating, then treated with gaseous plasma or a solution of sulfuric acid and hydrogen peroxide, and then overlaid with a photoresist and having an opening through the photoresist and the plasma-treated anti-reflective coating or sulfuric acid/hydrogen peroxide-treated anti-reflective coating, wherein the portion of the opening through the plasma-treated anti-reflective coating or sulfuric acid/hydrogen peroxide-treated anti-reflective coating has essentially the same width as the portion of the opening through the photoresist.

FIG. 9 shows the transfer of the pattern in the photoresist 3 of FIG. 8 to the anti-reflective coating 7, thereby forming a second mask. FIG. 9 shows the silicon structure of FIG. 8 wherein the portion of the plasma-treated anti-reflective coating or portion of sulfuric acid/hydrogen peroxide-treated anti-reflective coating 9 underneath the developed portion of the photoresist 3 has been removed. Although shown in FIG. 8 and FIG. 9 as two distinct steps, the portion of the cured or uncured photoresist 3 defined by depth 4a and width 5 and the portion of the plasma-treated anti-reflective coating or portion of the sulfuiric acid/hydrogen peroxide-treated anti-reflective coating 9 defined by depth 4b and width 5a may be removed under the same is conditions and thus occur in the same process step, which may be accomplished by techniques and procedures well known to one of ordinary skill in the art. FIG. 9 shows a cross-section of a silicon substrate 1 overlaid with a dielectric layer 2 which is in turn overlaid with an anti-reflective coating 7 (not shown), then treated with gaseous plasma or a solution of sulfuiric acid and hydrogen peroxide to give plasma-treated anti-reflective coating or sulfuric acid/hydrogen peroxide-treated anti-reflective coating 9, and then overlaid with a photoresist 3. An opening 4 defined by depth 4a through the photoresist 3, width 5 at the top of opening 4, and width 5a at the interface of the plasma-treated anti-reflective coating or sulfuric acid/hydrogen peroxide-treated anti-reflective coating 9 and photoresist 3 is formed. Opening 4 is further defined by depth 4b through the plasma-treated anti-reflective coating or sulfuric acid/hydrogen peroxide-treated anti-reflective coating 9, width 5a at the interface of the plasma-treated anti-reflective coating or sulfuric acid/hydrogen peroxide-treated anti-reflective coating 9 and photoresist 3, and width 10 at the interface of the dielectric layer 2 and the plasma-treated anti-reflective coating or sulfuric acid/hydrogen peroxide-treated anti-reflective coating 9. As a result of width 5a at the interface of the plasma-treated anti-reflective coating or sulfuiric acid/hydrogen peroxide-treated anti-reflective coating 9 and photoresist 3 being essentially the same as width 5 at the top of opening 4 through photoresist 3 as shown and described in FIG. 8, width 10 at the interface of dielectric layer 2 and plasma-treated anti-reflective coating or sulfuric acid/hydrogen peroxide-treated anti-reflective coating 9 is essentially the same as width 5 at the top of opening 4, the pattern in the photoresist 3 has been accurately transferred to the plasma-treated anti-reflective coating or sulfuric acid/hydrogen peroxide-treated anti-reflective coating 9.

Figure 10:
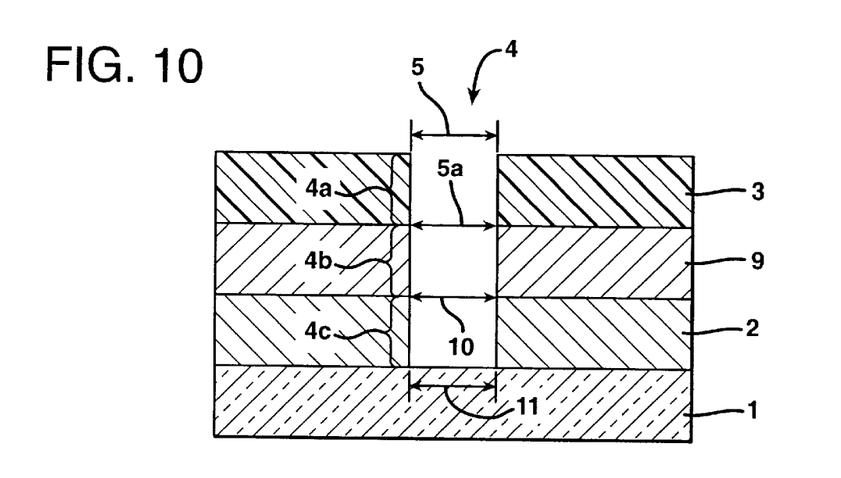
FIG. 10 depicts a cross-section of a silicon substrate overlaid with a dielectric layer which is in turn overlaid with an anti-reflective coating, then treated with gaseous plasma or a solution of sulfuric acid and hydrogen peroxide, and then overlaid with a photoresist and having an opening through the photoresist, the plasma-treated anti-reflective coating or sulfuric acid/hydrogen peroxide-treated anti-reflective coating, and the dielectric layer, wherein the portion of the opening through the dielectric layer, the portion of the opening through plasma-treated anti-reflective coating or sulfuric acid/hydrogen peroxide-treated anti-reflective coating, and the portion of the opening through the photoresist all have essentially the same width.

FIG. 10 shows the transfer of the pattern in the anti-reflective coating 7 in FIG. 9 to the dielectric layer 2. FIG. 10 shows the silicon structure of FIG. 9 wherein the portion of dielectric layer 2 is etched through opening 4. FIG. 10 depicts a cross-section of a silicon substrate 1 overlaid with a dielectric layer 2 which is in turn overlaid with an anti-reflective coating 7 (not shown), then treated with gaseous plasma or a solution of sulfuric acid and hydrogen peroxide to give plasma-treated anti-reflective coating or sulfuric acid/hydrogen peroxide-treated anti-reflective coating 9, and then overlaid with a photoresist 3. Although shown in FIG. 9.and FIG. 10 as two distinct steps, the portion of the dielectric layer 2 defined by depth 4c and width 10 and the portion of the plasma-treated anti-reflective coating or sulfuric acid/hydrogen peroxide-treated anti-reflective coating 9 defined by depth 4b and width 5a may be removed under the same conditions and thus occur in the same process step, which may be accomplished by techniques and procedures well known to one of ordinary skill in the art. In addition, although shown in FIG. 8, FIG. 9, and FIG. 10 as three distinct steps, the portion of the cured or uncured photoresist 3 defined by depth 4a and width 5, the portion of the plasma-treated anti-reflective coating or sulfuric acid/hydrogen peroxide-treated anti-reflective coating 9 defined by depth 4b and width 5a, and the portion of the dielectric layer 2 defined by depth 4c and width 10 may be removed under the same conditions and thus occur in the same process step, which may be accomplished by techniques and procedures well known to one of ordinary skill in the art. An opening 4 which is defined by depth 4a through the photoresist 3, width 5 at the top of opening 4, and width 5a at the interface of the plasma-treated anti-reflective coating or sulfuric acid/hydrogen peroxide-treated anti-reflective coating 9 and photoresist 3 is formed. Opening 4 is further defined by depth 4b through the plasma-treated anti-reflective coating or sulfuric acid/hydrogen peroxide-treated anti-reflective coating 9, width 5a at the interface of the plasma-treated anti-reflective coating or sulfuric acid/hydrogen peroxide-treated anti-reflective coating 9 and photoresist 3, and width 10 at the interface of the dielectric layer 2 and the plasma-treated anti-reflective coating or sulfuric acid/hydrogen peroxide-treated anti-reflective coating 9. Opening 4 is still further defined by depth 4c through the dielectric layer 2, width 10 at the interface of the dielectric layer 2 and the plasma-treated anti-reflective layer or sulfuric acid/hydrogen peroxide-treated anti-reflective coating 9, and width 11 at the interface of the silicon substrate 1 and the dielectric layer 2. As a result of width 10 at the interface of dielectric layer 2 and plasma-treated anti-reflective coating or sulfuric acid/hydrogen peroxide-treated anti-reflective coating 9 is essentially the same as width 5 at the top of opening 4 as shown and described in FIG. 9, width 11 at the interface of silicon substrate 1 and the dielectric layer 2 is essentially the same as width 5 at the top of opening 4, the pattern in the plasma-treated anti-reflective coating or sulfuric acid/hydrogen peroxide-treated anti-reflective coating 9 has been accurately transferred to the dielectric layer 2.

Figure 11:
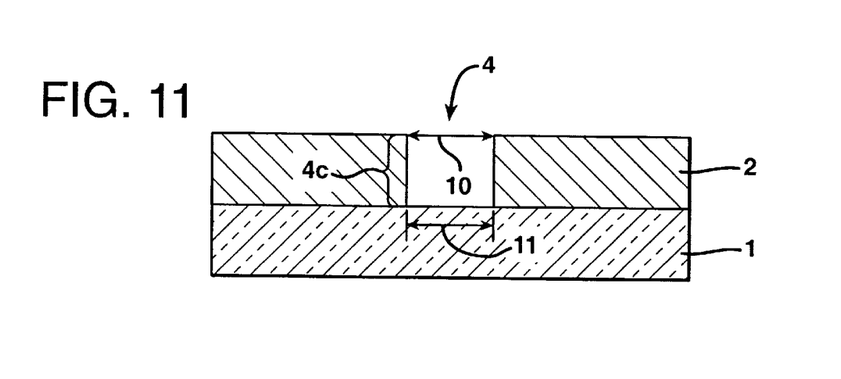
FIG. 11 depicts a cross-section of a silicon substrate overlaid with a dielectric layer and having an opening through the dielectric layer.

FIG. 11 shows a cross-section of the silicon structure of FIG. 10 wherein the photoresist 3 and plasma-treated anti-reflective coating or sulfuric acid/hydrogen peroxide-treated anti-reflective coating 9 have been stripped from the dielectric layer 2. FIG. 11 shows a silicon substrate 1 overlaid with a dielectric layer 2 and having an opening 4 through the dielectric layer 2, wherein opening 4 is defined by depth 4c through dielectric layer 2, width 11 at the interface of the silicon substrate 1 and the dielectric layer 2, and width 10 at the top of the opening 4. As a result of width 11 at the interface of silicon substrate 1 and the dielectric layer 2 being essentially the same as width 5 at the top of opening 4, the portion of opening 4 through the dielectric layer 2 has essentially the same dimensions as the portion of the opening 4 through the photoresist 3, as shown in FIG. 10, critical dimensions have been maintained throughout the photolithography process as a result of accurate pattern transfer throughout the process. Although FIG. 11 shows the removal of both the plasma-treated anti-reflective coating or sulfuric acid/hydrogen peroxide-treated anti-reflective coating 9 and photoresist 3, in certain circumstances it is desirable to leave the plasma-treated anti-reflective coating or sulfuric acid/hydrogen peroxide-treated anti-reflective coating 9 in place. The selective removal of the photoresist in the presence of the plasma-treated anti-reflective coating is accomplished by techniques and procedures well known to one of ordinary skill in the art.

Therefore, the present invention provides an improved photolithography technique whereby the beneficial effects of using an anti-reflective coating may be realized while maintaining critical dimensions in each subsequent step through accurate transfer of pattern masks.

What is claimed is:

1. A film within a semiconductor device comprising at least one layer of an anti-reflective coating which has been treated with a solution comprising sulfuric acid and hydrogen peroxide.

2. A film according to claim 1 comprising a plurality of layers.

3. A film according to claim 2 comprising a dielectric layer and said at least one layer of an anti-reflective coating which has been treated with a solution comprising sulfuiric acid and hydrogen peroxide on said dielectric layer.

4. A film according to claim 3 wherein the dielectric layer comprises a material selected from the group consisting of silicon dioxide and silicon nitride.

5. A film according to claim 1 wherein the anti-reflective coating is selected from the group consisting of silicon-rich oxides defined by the formulas $Si_xO_y$ and $Si_xO_y{:}H_n$, and silicon-rich oxynitrides, defined by the formulas $Si_xO_yN_z$ and $Si_xO_yN_z{:}H_n$, and silicon nitrides defined by the formulas $Si_xN_z$ and $Si_xN_z{:}H_n$, wherein in all formulas, x, y, z, and n represent the atomic percentage of silicon, oxygen, nitrogen, and hydrogen, respectively.

6. A film according to claim 5 wherein the anti-reflective coating is selected from the group consisting of silicon-rich oxynitrides defined by the formula $Si_xO_yN_z$ wherein x is from about 0.36 to about 0.65, y is from about 0.02 to about 0.56, and z is from about 0.07 to about 0.33.

7. A film according to claim 5 wherein the anti-reflective coating is deposited to a thickness range of from about 100 Å to about 1000 Å.

8. A film according to claim 7 wherein the anti-reflective coating is deposited to a thickness of about 600 Å.

9. A film within a semiconductor device comprising at least one layer of an anti-reflective coating which has been treated with a gaseous plasma selected from the group consisting of He, $O_2$/He, and $O_3$/He.

10. A film within a semiconductor device comprising at least one layer of an anti-reflective coating which has been treated with a gaseous plasma, wherein the anti-effective coating is selected from the group consisting of silicon-rich oxides defined by the formulas $Si_xO_y$ and $Si_xO_y{:}H_n$, and silicon-rich oxynitrides, defined by the formulas $Si_xO_yN_z$ and $Si_xO_yN_z{:}H_n$, and silicon nitrides defined by the formulas $Si_xN_z$ and $Si_xN_z{:}H_n$, wherein in all formulas, x, y, z, and n represent the atomic percentage of silicon, oxygen, nitrogen, and hydrogen, respectively; wherein the anti-reflective coating is deposited to a thickness range of from about 100 Å to about 1000 Å; and wherein the gaseous plasma is selected from the group consisting of He, $O_2$/He, and $O_3$/He.

11. A semiconductor device having a layer of an anti-reflective coating which has been treated with a solution comprising sulfuric acid and hydrogen peroxide.

12. A semiconductor device according to claim 11 wherein the anti-reflective coating is selected from the group consisting of silicon-rich oxides defined by the formulas $Si_xO_y$ and $Si_xO_y{:}H_n$, and silicon-rich oxynitrides, defined by the formulas $Si_xO_yN_n$ and $Si_xO_yN_z{:}H_n$, and silicon nitrides defined by the formulas $Si_xN_z$ and $Si_xN_z{:}H_n$, wherein in all formulas, x, y, z, and n represent the atomic percentage of silicon, oxygen, nitrogen, and hydrogen, respectively.

13. A semiconductor device according to claim 12 wherein the anti-reflective coating is selected from the group consisting of silicon-rich oxynitrides defined by the formula $Si_xO_yN_z$, wherein x is from about 0.36 to about 0.65, y is from about 0.02 to about 0.56, and z is from about 0.07 to about 0.33.

14. A semiconductor device having a layer of anti-reflective coating which has been treated with gaseous plasma selected from the groups consisting of He, $O_2$/He, and $O_3$/He.

15. A patterned silicon structure comprising a silicon substrate; an anti-reflective coating on an upper surface of said silicon substrate, said anti-reflective coating having been treated with a solution comprising sulfuric acid and hydrogen peroxide; a patterned photoresist layer on said treated anti-reflective coating having at least one opening therein, the interface between said photoresist layer and said anti-reflective layer having no footings from said photoresist.

16. A patterned silicon structure as claimed in claim 15 further including an opening in said treated anti-reflective coating which lies beneath said at least one opening in said pattern in said photoresist layer, said at least one opening in said pattern in said treated anti-reflective coating having substantially the same width as said opening in said photoresist layer.

17. A patterned silicon structure as claimed in claim 15 wherein said anti-reflective coating is selected from the group consisting of silicon-rich oxides defined by the formulas $Si_xO_y$ and $Si_xO_y{:}H_n$, and silicon-rich oxynitrides, defined by the formulas $Si_xO_yN_z$ and $Si_xO_yN_z{:}H_n$, and silicon nitrides defined by the formulas $Si_xN_z$ and $Si_xN_z{:}H_n$, wherein in all formula, x, y, z, and n represent the atomic percentage of silicon, oxygen, nitrogen, and hydrogen, respectively.

18. A patterned silicon structure as claimed in claim 17 wherein the anti-reflective coating is selected from the group consisting of silicon-rich oxynitrides defined by the formula $Si_xO_yN_n$ wherein x is from about 0.36 to about 0.65, y is from about 0.02 to about 0.56, and z is from about 0.07 to about 0.33.

19. A patterned silicon structure as claimed in claim 17 wherein the anti-reflective coating is deposited on said substrate to a thickness range of from about 100 Å to about 100 Å.

20. A patterned silicon structure comprising a silicon substrate; an anti-reflective coating on an upper surface of said silicon substrate, said anti-reflective coating having been treated with a gas plasma selected from the group consisting of He, $O_2$/He, and $O_3$/He; a patterned photoresist layer on said plasma-treated anti-reflective coating having at least one opening therein, the interface between said photoresist layer and said anti-reflective layer having no footings from said photoresist.

21. A patterned silicon structure as claimed in claim 20 further including an opening in said plasma-treated anti-reflective coating which lies beneath said at least one opening in said pattern in said photoresist layer, said at least one opening in said pattern in said plasma-treated anti-reflective coating having substantially the same width as said opening in said photoresist layer.

22. A patterned silicon structure as claimed in claim 20 wherein said anti-reflective coating is selected from the group consisting of silicon-rich oxides defined by the formulas $Si_xO_y$ and $Si_xO_y{:}H_n$, and silicon-rich oxynitrides, defined by the formulas $Si_xO_yN_n$ and $Si_xO_yN_n$, and silicon nitrides defined by the formulas $Si_xN_n$ and $Si_xN_z{:}H_n$, wherein in all formulas, x, y, z, and n represent the atomic percentage of silicon, oxygen, nitrogen, and hydrogen, respectively.

23. A patterned silicon structure as claimed in claim 22 wherein t he anti-reflective coating is selected from the group consisting of silicon-rich oxynitrides defined by the formula $Si_xO_yN_z$ wherein x is from about 0.36 to about 0.65, y is from about 0.02 to about 0.56, and z is from about 0.07 to about 0.33.

24. A patterned silicon structure as claimed in claim 22 wherein the anti-reflective coating is deposited on said substrate to a thickness range of from about 100 Å to about 1000 Å.

* * * * *

UNITED STATES PATENT AND TRADEMARK OFFICE
CERTIFICATE OF CORRECTION

PATENT NO. : 6,380,611 B1
DATED : April 30, 2002
INVENTOR(S) : Yin et al.

It is certified that error appears in the above-identified patent and that said Letters Patent is hereby corrected as shown below:

<u>Column 8,</u>
Line 54, "dielectric layer which" should be -- dielectric layer 2 which --;

<u>Column 10,</u>
Lines 33 and 34, "same is conditions" should be -- same conditions --;

<u>Column 12,</u>
Line 61, "anti-effective" should be -- anti-reflective --;

<u>Column 13,</u>
Line 46, "formula" should be -- formulas --;

<u>Column 14,</u>
Line 10, "100 Å" should be -- 1000 Å --;
Line 32, "$Si_xO_yN_n$ and $Si_xO_yN_n$," should be -- $Si_xO_yN_z$ and $Si_xO_yN_z:H_n$, --;
Line 33, "$Si_xN_n$" should be -- $Si_xN_z$ --.
Line 38, "t he" should be -- the --;

Signed and Sealed this

Fifteenth Day of October, 2002

Attest:

Attesting Officer

JAMES E. ROGAN
*Director of the United States Patent and Trademark Office*